(12) United States Patent
Setton

(10) Patent No.: US 7,042,033 B2
(45) Date of Patent: May 9, 2006

(54) ULSI MOS WITH HIGH DIELECTRIC CONSTANT GATE INSULATOR

(75) Inventor: Michael Setton, Isere (FR)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/622,652

(22) Filed: Jul. 21, 2003

(65) Prior Publication Data

US 2004/0070036 A1    Apr. 15, 2004

Related U.S. Application Data

(62) Division of application No. 09/109,992, filed on Jun. 30, 1998, now Pat. No. 6,727,148.

(51) Int. Cl.
*H01L 29/76* (2006.01)
*H01L 29/792* (2006.01)
*H01L 21/285* (2006.01)

(52) U.S. Cl. ............... 257/295; 257/324; 257/411; 257/412; 257/E21.165

(58) Field of Classification Search ............... 257/295, 257/324, 316, 411, 412, 368, E21.165, E21.433, 257/E21.435, E21.439, E21.665, E29.272
See application file for complete search history.

(56) References Cited

U.S. PATENT DOCUMENTS

| | | | |
|---|---|---|---|
| 3,731,163 A | 5/1973 | Shukus | |
| 4,670,355 A | 6/1987 | Matsudaira | |
| 4,734,340 A | 3/1988 | Saito et al. | |

(Continued)

FOREIGN PATENT DOCUMENTS

EP    0844647 A3    5/1998

(Continued)

OTHER PUBLICATIONS

Alers, G.B. et al., "Nitrogen plasma annealing for low temperature $Ta_2O_5$ films", Applied Physics Letters, vol. 72, No. 11, 1308-1310, Mar. 16, 1998.

(Continued)

*Primary Examiner*—Michael Lebentritt
*Assistant Examiner*—Ron Pompey
(74) *Attorney, Agent, or Firm*—Buchanan Ingersoll

(57) ABSTRACT

MOS transistor formed on a semiconductor substrate of a first conductivity type and method of fabrication are provided. The device includes (a) an interfacial layer formed on the substrate; (b) a high dielectric constant layer covering the interfacial layer that comprises a material that is selected from the group consisting of $Ta_2O_5$, $Ta_2(O_{1-x}N_x)_5$ wherein x ranges from greater than 0 to 0.6, a solid solution of $(Ta_2O_5)_r$—$(TiO_2)_{1-r}$ wherein r ranges from about 0.9 to less than 1, a solid solution $(Ta_2O_5)_s$—$(Al_2O_3)_{1-s}$ wherein s ranges from 0.9 to less than 1, a solid solution of $(Ta_2O_5)_t$—$(ZrO_2)_{1-t}$ wherein t ranges from about 0.9 to less than 1, a solid solution of $(Ta_2O_5)_u$—$(HfO_2)_{1-u}$ wherein u ranges from about 0.9 to less than 1, and mixtures thereof wherein the interfacial layer separates the high dielectric constant layer from the substrate; (b) a gate electrode having a width of less than 0.3 micron covering the high dielectric constant layer; (d) first and second lightly doped regions of a second conductivity type disposed on respective areas of the substrate surface; (e) a source and drain regions of the second conductivity type; and (f) a pair of spacers formed adjacent to the gate electrode and formed on the high dielectric constant layer. The high dielectric layer can be subject to densification. The gate oxide material will significantly improve the performance of an MOS device by reducing or eliminating the current leakage associated with prior art devices.

19 Claims, 3 Drawing Sheets

U.S. PATENT DOCUMENTS

| | | | |
|---|---|---|---|
| 5,091,763 A * | 2/1992 | Sanchez | 257/344 |
| 5,189,503 A | 2/1993 | Suguro et al. | |
| 5,200,352 A * | 4/1993 | Pfiester | 438/231 |
| 5,292,673 A | 3/1994 | Shinriki et al. | |
| 5,316,977 A | 5/1994 | Kunishima et al. | |
| 5,322,809 A * | 6/1994 | Moslehi | 438/303 |
| 5,439,839 A * | 8/1995 | Jang | 438/303 |
| 5,596,214 A | 1/1997 | Endo | |
| 5,677,015 A | 10/1997 | Hasegawa | |
| 5,688,724 A | 11/1997 | Yoon et al. | |
| 5,702,972 A | 12/1997 | Tsai et al. | |
| 5,880,508 A * | 3/1999 | Wu | 257/411 |
| 5,922,673 A * | 7/1999 | Gluckman et al. | 514/2 |
| 6,087,238 A * | 7/2000 | Gardner et al. | 438/304 |
| 6,107,656 A | 8/2000 | Igarashi | |
| 6,458,645 B1 | 10/2002 | DeBoer et al. | |

FOREIGN PATENT DOCUMENTS

| | | |
|---|---|---|
| JP | 60-107838 | 6/1985 |

OTHER PUBLICATIONS

Campbell, S.A., et al., MOSFET Transistors Fabricated with High Permitivity $TiO_2$ Dielectrics, IEEE Transactions on Electron Device, vol. 44, No. 1, 104-109, Jan. 1997.

Cava, R.F. et al., "Enhancement of the dielectric constant of $Ta_2O_5$ through substitution with $TiO_2$", Nature, vol. 377, 215-217, Sep. 21, 1995.

Chatterjee, A. et al., "Sub-100nm Gate Length Metal Gate NMOS Transistors Fabricated by a Replacement Gate Process", IEEE, 1997.

Gan, J.-Y et al., "Dielectric property of $(TiO_2)_x$—$(Ta_2O_5)_{1-x}$ thin films", Appl. Phys, Lett. 72 (3), Jan. 19, 1998, 332-334.

Hu, J.C. et al., "Feasibility of Using W/TiN as Metal Gate for conventional 0.13 μm CMOS Technology and Beyond", IEEE, 1997.

Joshi, P.C., et al., "Structural and electrical properties of crystalline (1-x) $Ta_2O_5$—$xAl_2O_3$ thin films fabricated by metalorganic solution deposition technique", Apply. Phys. Lett. 71 (10), Sep. 8, 1997, 1341-1343.

Lo, G.Q. et al., Metal-oxide-semiconductor characteristics of chemical vapor deposited $Ta_2O_5$ films, Appl. Phys. Lett. 60 (26), 3286-3288, Jun. 1992.

Meng, J.F., et al., "Raman Investigation on $(Ta_2O_5)_{1-x}$ $(TiO_2)_x$ System at Different Temperatures and Pressures", J. Phys. Chem Solids, vol. 58, No. 10, 1503-1506, 1997.

Momiyama, Y., et al., "Ultra-Thin $Ta_2O_5/SiO_2$ Gate Insulator with TiN Gate Technology for 0.1 μm MOSFETs", 1997 Symposium on VLSI Technology digest of Technical Papers.

Properties of Metal Silicides, INSPEC emis datareviews series No. 14, 1995, Maex and Van Rossum Editors, pp 103-104.

Ting, C.Y., et al., "Gate Materials Consideration for Submicron CMOS", Applied Surface Science 38 (1989) 416-428.

Ushiki T., et al., "High-Performance, Metal-Gate SOI CMOS Fabricated by Ultraclean, Low-Temperature Process Technologies", SPIE, vol. 2875, pp 28-38, Aug. 1996.

Vogel, E.M., et al., "Modeled Tunnel Currents for High Dielectric constant Dielectrics", IEEE Transactions on Electron Devices, vol. 45, No. 6, 1350-1355, Jun. 1998.

Pratt, I.H., "Thin-Film Dielectric Properties of R.F. Sputtered Oxides", *Solid State Technology*, (Dec. 1969), vol. 12, No. 12, 49-57.

Reddy, P.K, et al., "Dielectric Properties of Tantalum Oxynitride Films", *Physica Status Solidi A*, Jul. 1979, vol. 54, No. 1, pp. K63-K66.

Vlasov, Y.G. et al., "Analytical applications of pH-ISFETs", *Sensors and Actuators B*, (Dec. 1992) vol. B10, No. 1, pp. 1-6.

Patent Abstracts of Japan, vol. 098, No. 11, Sep. 1998, JP 10 178170A.

Chinese Official Action dated Apr. 18, 2003 for Application No. 99808151.5.

* cited by examiner

ULSI MOS WITH HIGH DIELECTRIC CONSTANT GATE INSULATOR

This application is a division of application Ser. No. 09/109,992, filed Jun. 30, 1998, now U.S. Pat. No. 6,727,148.

FIELD OF THE INVENTION

The present invention relates generally to methods for fabricating integrated circuits using metal oxide semiconductor (MOS) technology. More particularly, the present invention relates to MOS devices with a gate width of less than 0.3 micron.

BACKGROUND OF THE INVENTION

Metal oxide semiconductors are well known in the art. With the rapid integration of elements in the device, the thickness of the silicon oxide gate dielectric layer has approached the 2 nm thickness level. Such thin gate oxide layers require stringent protocols during fabrication especially in the gate etching process. In addition, concomitant with this reduction in the thickness of the gate oxide layer is the device's high leakage current caused by direct tunneling effects.

Shinriki et. al., U.S. Pat. No. 5,292,673 describes a MOSFET that contains a tantalum pentoxide gate insulating film. Although the patent asserts that the device exhibits improved electrical characteristics, nevertheless, it is believed that the device suffers from, among other things, high leakage currents because of the silicon oxide layer, which is formed by reoxidation between the tantalum pentoxide gate insulating film and the silicon substrate, has defects including non-uniformity.

SUMMARY OF THE INVENTION

The present invention is based in part on the recognition that employing a gate dielectric layer formed at least in part from a high dielectric constant material comprising $Ta_2O_5$ will significantly improve the performance of the MOS device by, among other things, reducing or eliminating the current leakage associated with prior art devices.

Accordingly, in one aspect the invention is directed to a method for fabricating an MOS device having a gate width of less than 0.3 micron that includes the steps of:

(a) forming an interfacial layer on a semiconductor substrate of a first conductive type wherein the interfacial layer is preferably sufficiently thin to limit parasitic capacitance of the device;

(b) forming a high dielectric constant layer on the interfacial layer that comprises a material that is selected from the group consisting of $Ta_2O_5$, $Ta_2(O_{1-x}N_x)_5$ wherein x ranges from greater than 0 to 0.6, a solid solution of $(Ta_2O_5)_r$—$(TiO_2)_{1-r}$ wherein r ranges from about 0.9 to less than 1, a solid solution $(Ta_2O_5)_s$—$(Al_2O_3)_{1-s}$ wherein s ranges from 0.9 to less than 1, a solid solution of $(Ta_2O_5)_t$—$(ZrO_2)_{1-t}$ wherein t ranges from about 0.9 to less than 1, a solid solution of $(Ta_2O_5)_u$—$(HfO_2)_{1-u}$ wherein u ranges from about 0.9 to less than 1, and mixtures thereof wherein the interfacial layer separates the high dielectric constant layer from the substrate;

(c) depositing a layer of electrically conductive material on the high dielectric constant layer;

(d) selectively removing portions of the layer of electrically conductive material to form a gate electrode and to expose portions of the high dielectric constant layer;

(e) implanting impurity ions through the exposed portions of the high dielectric constant layer into the substrate to form source and drain regions of a second conductive type;

(f) forming first spacers that are adjacent the gate electrode and cover portions of the source and drain regions of the second conductive type;

(g) removing the exposed portions of the high dielectric constant layer;

(h) implanting a second dose of impurity ions into the source and drain regions;

(i) depositing a layer of insulator material over the surface of the device, wherein the layer of insulator material may have an irregular surface;

(j) optionally, planarizing the surface of the insulator material;

(k) removing portions of the insulator material to form contact holes in the insulator material that are in communication with the source and drain regions; and (l) filling the contact holes with contact material.

In preferred embodiments, the electrically conductive material comprises metal that is selected from the group consisting of TiN, W, Ta, Mo and mixtures thereof. Alternatively, the electrically conductive material comprises doped polysilicon.

In another embodiment the method includes the step of forming second spacers that are adjacent the first spacers and cover portions of the source and drain regions following step (g) and before step (h) and/or the step of forming a silicide layer on the source and drain regions following step (h).

In another aspect, the invention is directed to an MOS transistor formed on a semiconductor substrate of a first conductivity type that includes:

(a) an interfacial layer formed on the substrate;

(b) a high dielectric constant layer covering the interfacial layer that comprises a material that is selected from the group consisting of $Ta_2O_5$, $Ta_2(O_{1-x}N_x)_5$ wherein x ranges from greater than 0 to 0.6, a solid solution of $(Ta_2O_5)_r$—$(TiO_2)_{1-r}$ wherein r ranges from about 0.9 to less than 1, a solid solution $(Ta_2O_5)_s$—$(Al_2O_3)_{1-s}$ wherein s ranges from 0.9 to less than 1, a solid solution of $(Ta_2O_5)_t$—$(ZrO_2)_{1-t}$ wherein t ranges from about 0.9 to less than 1, a solid solution of $(Ta_2O_5)_u$—$(HfO_2)_{1-u}$ wherein u ranges from about 0.9 to less than 1, and mixtures thereof wherein the interfacial layer separates the high dielectric constant layer from the substrate;

(c) a gate electrode having a width of less than 0.3 micron covering the high dielectric constant layer;

(d) first and second lightly doped regions of a second conductivity type disposed on respective areas of the substrate surface;

(e) a source and drain regions of the second conductivity type; and (f) a pair of spacers formed adjacent to the gate electrode and formed on the high dielectric constant layer.

In a preferred embodiment, the MOS transistor also includes an insulator layer covering the device and defining a first contact hole that is filled with a first contact material and a second contact hole that are filled with a second contact material, wherein the insulator layer has a substantially planar surface.

DETAILED DESCRIPTION OF THE PREFERRED EMBODIMENTS

It is to be noted that "n+" and "n−" are used throughout the present disclosure. The short hand notation specifies the electron concentration of various regions of a metal-oxide-semiconductor device. For instance, "n−" specifies a region of light electron concentration (on the order of $1 \times 10^{18}$ cm$^{-3}$) while "n+" specifies a region of high electron concentration (on the order of $1 \times 10^{20}$ cm$^{-3}$).

Figure 1A:
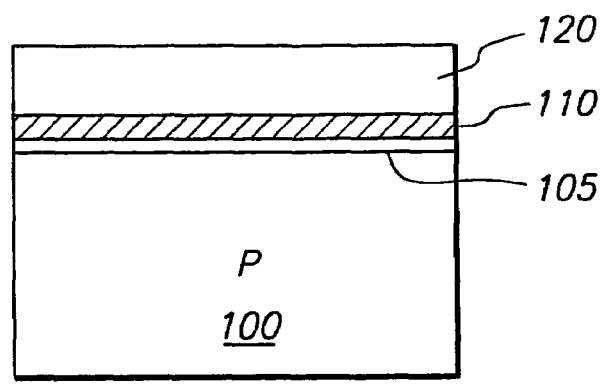
FIGS. 1A through 1H illustrate the steps in fabricating an MOS device according to the present invention.

FIGS. 1A–1H illustrate an exemplary method for fabricating an integrated circuit device with the inventive process. A p type semiconductor substrate will be employed for illustrative purposes. Therefore, n− source and n− drain regions and n+ source and n+ drain regions are formed in the substrate. Referring to FIG. 1A, silicon substrate 100 has an interfacial layer 105 preferably comprising $SiO_2$, $Si_3N_4$, or silicon oxynitride formed on an upper surface of the substrate. The interfacial layer is formed by conventional processes, such as, for example, rapid thermal processing (RTP), thermal annealing, CVD, plasma nitridation or oxidation, or wet chemical treatment, such as immersion into boiling nitric acid. A preferred method of forming the interfacial layer comprises exposing the silicon substrate in an RF or microwave plasma in an atmosphere containing ozone, oxygen, $N_2O$, nitrogen, or mixtures thereof. The interfacial layer serves to prevent reaction of $Ta_2O_5$ in layer 110 with the silicon substrate. The interfacial layer will have a thickness that is sufficient to prevent reaction between the high dielectric constant layer and the silicon substrate and the thickness typically ranges from about 1 nm to 5 nm and preferably about 1 nm to 2 nm.

Subsequently, high dielectric constant layer 110 and electrically conductive layer 120 are formed on interfacial layer 105. The high dielectric constant layer 110 preferably comprises material that is selected from $Ta_2O_5$, $Ta_2(O_{1-x}N_x)_5$ wherein x preferably ranges from greater than 0 to 0.6, a solid solution of $(Ta_2O_5)_r$—$(TiO_2)_{1-r}$ wherein r preferably ranges from about 0.9 to less than 1, a solid solution of $(Ta_2O_5)_s$—$(Al_2O_3)_{1-s}$ wherein s preferably ranges from 0.9 to less than 1, a solid solution of $(Ta_2O_5)_t$—$(ZrO_2)_{1-t}$ wherein t preferably ranges from about 0.9 to less than 1, a solid solution of $(Ta_2O_5)_u$—$(HfO_2)_{1-u}$ wherein u ranges from about 0.9 to less than 1, and mixtures thereof. Typically, the high dielectric constant layer will have a thickness that ranges from about 4 nm to 12 nm and preferably from about 5 nm to 10 nm. The high dielectric constant layer will form the gate oxide layer. The particular high dielectric constant materials employed with the present invention allows for a thicker gate oxide layer to be formed, resulting in less stringent requirements on gate etching selectivity during the fabrication process. In addition, it is believed that during operation of the MOS transistors, the devices will exhibit a higher transconductance parameter. Further, since Ta has already been used in MOS fabrication, $Ta_2O_5$ containing gate oxides are expected to be compatible with the materials in the other MOS materials. The high dielectric constant film can be fabricated by conventional means including, for example, LPCVD, PECVD, ECR CVD, UVCVD, and reactive sputtering.

In particular $Ta_2O_5$ films can be prepared by chemical vapor deposition (CVD) and physical vapor deposition (PVD) as described in Alers et al., "Nitrogen Plasma Annealing for Low Temperature $Ta_2O_5$ Films", Appl. Phys. Lett., Vol. 72, (11), March 1998, pages 1308–1310. $Ta_2(O_{1-x}N_x)_5$ films can be prepared by thermal CVD or plasma-assisted CVD as described in U.S. Pat. No. 5,677,015. $(Ta_2O_5)_r$—$(TiO_2)_{1-r}$ films can be prepared by RF magnetron sputtering deposition as described in Gan et al. "Dielectric property of $(TiO_2)_x$—$(Ta_2O_5)_{1-x}$ Thin Films", Appl. Phys. Lett. Vol. 72, (3), January 1998, pages 332–334 or by chemical CVD as described in U.S. Pat. No. 4,734,340. $(Ta_2O_5)_s$—$(Al_2O_3)_{1-s}$ films can be prepared by metalorganic solution deposition as described in Joshi et al., "Structural and electrical properties of crystalline $(1-x)Ta_2O_5$—$xAl_2O_3$ thin films fabricated by metalorganic solution deposition technique", Appl. Phys. Lett. Vol. 71, (10), September 1997. Each of the above cited references is incorporated herein. Finally, the $(Ta_2O_5)_t$—$(ZrO_2)_{1-t}$ and $(Ta_2O_5)_u$—$(HfO_2)_{1-u}$ thin fabricated by techniques used in fabricating the other solid solution materials. Prior to formation of the electrically conductive layer 120, the high dielectric constant material is preferably subjected to a densification process comprising, for example, exposing the silicon substrate to a RTP or an RF or microwave plasma in an atmosphere containing ozone, oxygen, $N_2O$, nitrogen, or mixtures thereof. Densification is further described in Alers et. al. cited above. Densification improves the high dielectric constant material with respect to the leakage current of the MOS device made.

Electrically conductive layer 120 preferably comprises one or more layers of a high melting metal such as, for example, TiN, W, Ta, Mo which can be deposited by sputtering. This layer typically has a thickness that ranges from about 100 nm to 300 nm, and preferably from about 150 nm to 250 nm. As will be described herein, this electrically conductive layer will form the gate electrode in this embodiment.

Figure 1B:
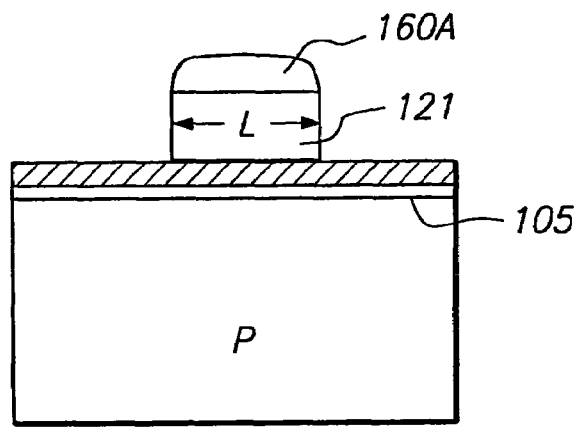

An optional oxide layer can be deposited and patterned over the electrically conductive layer 120. Subsequently, a layer of photoresist material 160 is applied onto electrically conductive layer 120 before the photoresist is masked and patterned using conventional photoresist techniques to form a gate pattern. After etching, the line width (L) of the gate 121 is typically less than 0.3 micron, and preferably equal to or less than about 0.18 micron. Etching down to the top high dielectric constant layer 110 removes the exposed electrically conductive material as shown in FIG. 1B. Source 190 and drain 180 regions are formed by self aligned ion implantation before the remaining photoresist material 160A is removed to form the device shown in FIG. 1C. As is apparent, interfacial layer 105 shown in FIGS. 1A and 1B is not shown in FIG. 1C or subsequent figures although the layer is present in the structures illustrated.

Figure 1C:
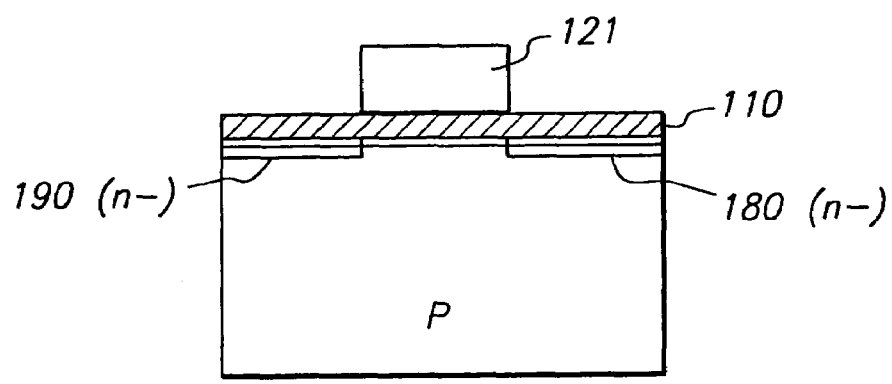
Figure 1D:
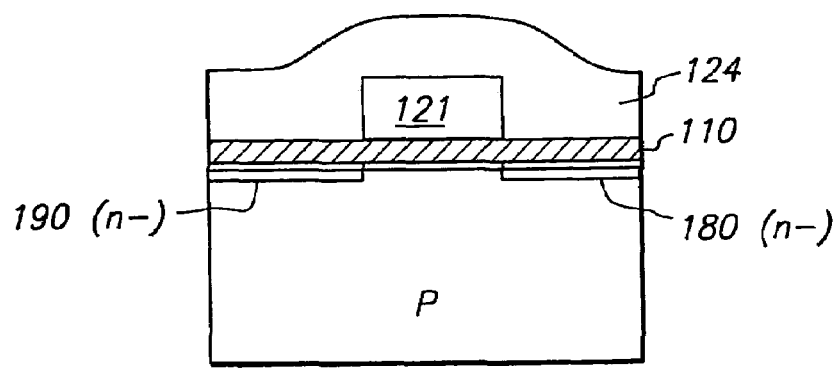
Figure 1E:
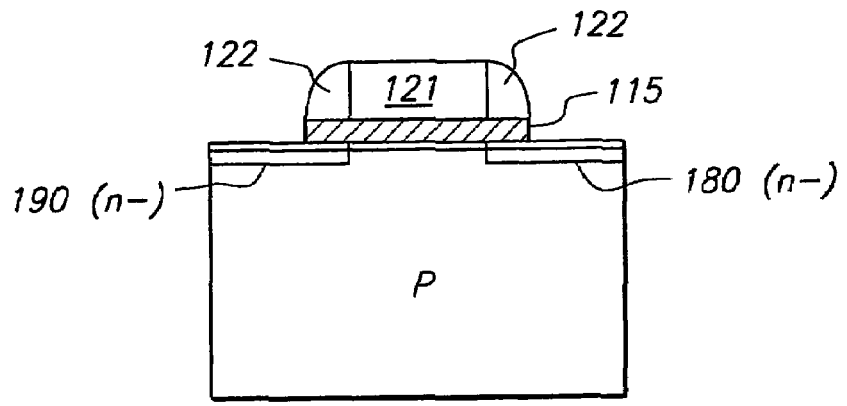
Figure 1F:
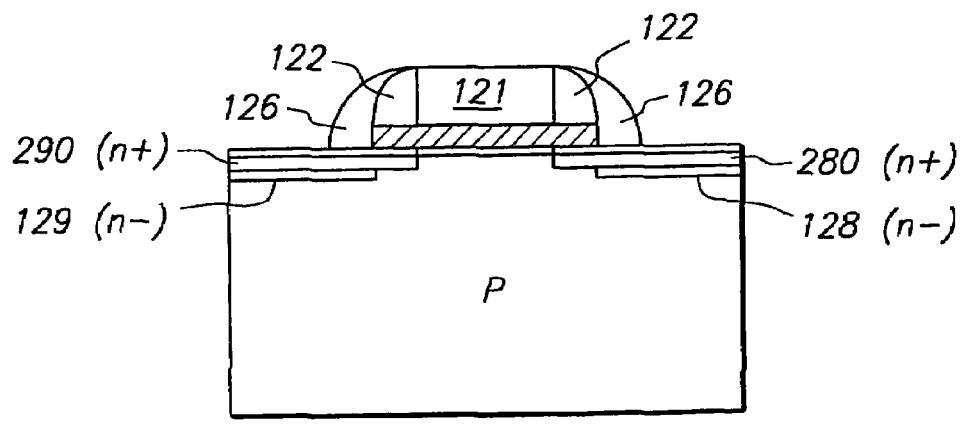

Referring to FIG. 1D, spacers 122 are formed by depositing a phosphosilicate glass (PSG) film 124 over the entire surface of the device of FIG. 1C and then anisotropic etching the glass. The spacers can also be made from oxides or nitrides. Subsequently, the exposed high dielectric constant material is removed by plasma etching using fluorine or chlorine containing etchant gases to yield the structure of FIG. 1E. The remaining layer of high dielectric material 115 serves as the gate oxide. Second spacers 126 are formed by the same procedure as for spacers 122. Lightly doped source (n−) 129 and drain (n−) 128 regions are then formed by ion implantation as shown in FIG. 1F with the concomitant formation of source (n+) 290 and drain (n+) 280 regions.

Silicide layers 133 and 132 are then formed on the source and drain regions. One method comprises the steps of (1) depositing a layer of suitable metal preferably titanium, cobalt, or multiple layers of these metals, over the surface of the device of FIG. 1F, (2) allowing the metal and silicon in the substrate to react, and thereafter (3) removing unreacted metal. Another method comprises depositing silicide, e.g., metal$_x$Si$_y$, directly onto source and drain regions using conventional selective deposition techniques, e.g., CVD.

Figure 1G:
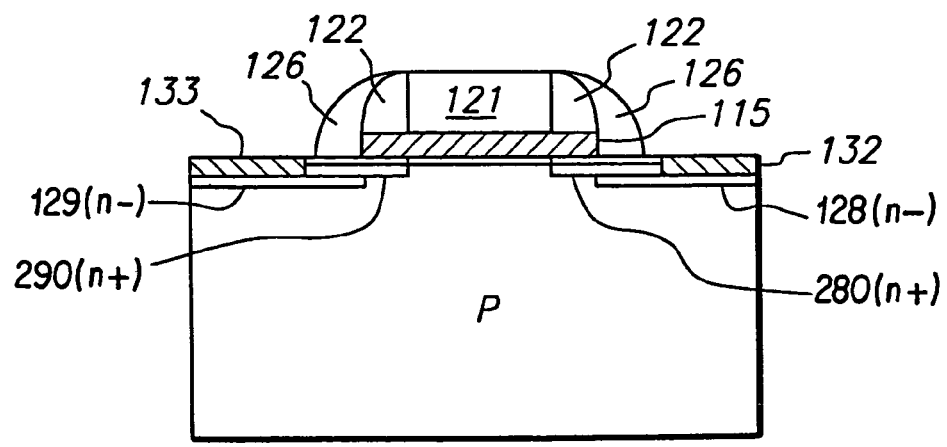
Figure 1H:
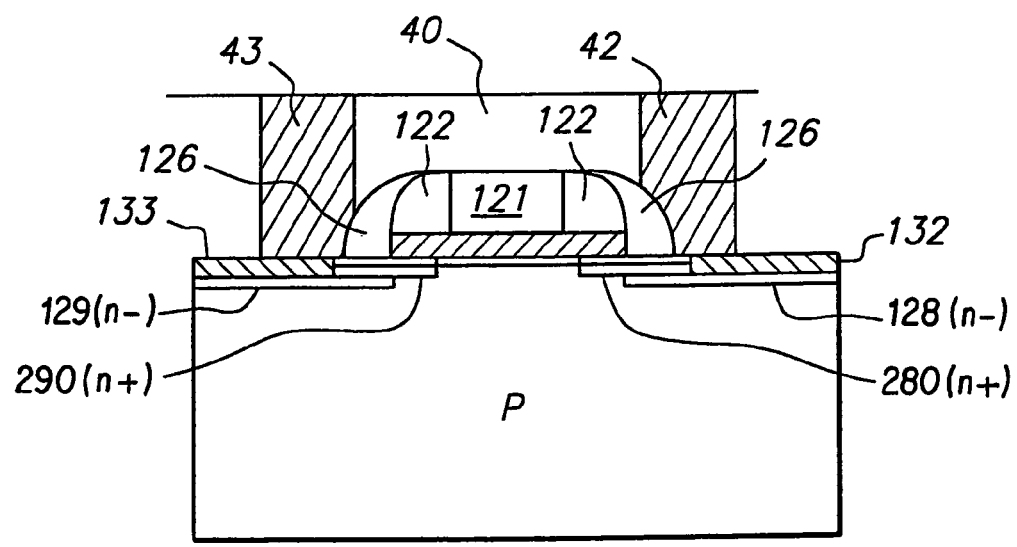

Following formation of the silicide regions, a conformal layer of PSG film 40 is deposited on the structure of FIG. 1G, thereafter, the top surface of the PSG film is planarized by conventional techniques such as chemical-mechanical polishing (CMP). CMP is particularly advantageous when small contact holes (less than 0.3 micron) are required. Subsequently, contact holes are etched in the PSG and they then filled with an electrically conductive, e.g., metal, material 42 and 43 as shown in FIG. 1H.

As is apparent, the above structure has a metal gate electrode 121. In an alternative embodiment, instead of a metal gate electrode, a doped polysilicon gate electrode can be employed. In this case, a doped polysilicon layer would be deposited in place of the electrically conductive 120 layer as shown in FIG. 1A. Optionally, a diffusion barrier layer made from a suitable material such as, for example, TiN, WN, and TaN, can be deposited between layers 110 and 120. This barrier layer, which is typically 5 nm to 15 nm thick, prevents polysilicon gate material from reacting with the tantalum pentoxide in the gate dielectric. In this scenario, the rest of the process would be essentially the same as above, however, the preferred silicidation procedure entails depositing a metal film over the structure so that a polycide layer on the surface of the doped polysilicon layer is formed as well.

It is to be emphasized that although n channel transistors have been described in detail herein, the present invention may also be practiced as a p channel transistor. In fabricating the p channel device, the doping conductives of the p channel device are simply opposite to those of the n channel device.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. An MOS transistor formed on a semiconductor substrate of a first conductivity type comprising:
   (a) an interfacial layer formed on the substrate;
   (b) a high dielectric constant layer formed on the interfacial layer that comprises a material that is selected from the group consisting of $Ta_2O_5$, $Ta_2(O_{1-x}N_x)_5$ wherein x ranges from greater than 0 to 0.6, a solid solution of $(Ta_2O_5)_r$—$(TiO_2)_{1-r}$ wherein r ranges from about 0.9 to less than 1, a solid solution $(Ta_2O_5)_s$—$(Al_2O_3)_{1-s}$ wherein s ranges from 0.9 to less than 1, a solid solution of $(Ta_2O_5)_t$—$(ZrO_2)_{1-t}$ wherein t ranges from about 0.9 to less than 1, a solid solution of $(Ta_2O_5)_u$—$(HfO_2)_{1-u}$ wherein u ranges from about 0.9 to less than 1, and mixtures thereof wherein the interfacial layer separates the high dielectric constant layer from the substrate;
   (c) a gate electrode having a width of less than 0.3 micron covering the high dielectric constant layer;
   (d) first and second lightly doped regions of a second conductivity type disposed on respective areas of the substrate surface;
   (e) a source and drain regions of a second conductivity type;
   (f) a pair of first non-conductive spacers formed adjacent to the gate electrode and formed on the high dielectric constant layer; and
   (g) a pair of second non-conductive spacers that are adjacent to the first spacers and the high dielectric constant layer and are formed on the interfacial layer.

2. The MOS transistor of claim 1 further comprising:
   (h) an insulator layer covering the device and defining a first contact hole that is filled with a first contact material and a second contact hole that are filled with a second contact material, wherein the insulator layer has a substantially planar surface.

3. The MOS transistor of claim 1 wherein the gate electrode is formed from a metal that is selected from the group consisting of TiN, W, Ta, Mo and multilayers thereof.

4. The MOS transistor claim 1 wherein the gate electrode comprises doped polysilicon.

5. The MOS transistor of claim 4 comprising a barrier layer between the gate electrode and the high dielectric constant layer.

6. The MOS transistor of claim 1 wherein the pair of second spacers that are adjacent to the first spacers are formed over the lightly doped regions.

7. The MOS transistor of claim 1 comprising a suicide layer on the source and drain regions.

8. The MOS transistor of claim 1 wherein the high dielectric constant material layer has a thickness that ranges from about 4 nm to 12 nm.

9. The MOS transistor of claim 1 wherein the high dielectric constant material is $Ta_2O_5$.

10. The MOS transistor of claim 1 wherein the high dielectric constant material is $Ta_2(O_{1-x}N_x)_5$ wherein x ranges from greater than 0 to 0.6.

11. The MOS transistor of claim 1 herein the high dielectric constant material is a solid solution of $(Ta_2O_5)_r$—$(TiO_2)_{1-r}$ wherein r ranges from about 0.9 to less than 1.

12. The MOS transistor of claim 1 wherein the high dielectric constant material is a solid solution $(Ta_2O_5)_s$—$(Al_2O_3)_{1-s}$ wherein s ranges from 0.9 to less than 1.

13. The MOS transistor of claim 1 wherein the high dielectric constant material is a solid solution $(Ta_2O_5)_t$—$(ZrO_2)_{1-t}$ wherein t ranges from about 0.9 to less than 1.

14. The MOS transistor of claim 1 wherein the high dielectric constant material is a solid solution of $(Ta_2O_5)_u$—$(HfO_2)_{1-u}$ wherein u ranges from about 0.9 to less than 1.

15. The MOS transistor of claim 1 wherein the substrate comprises silicon.

16. The MOS transistor of claim 1 wherein the first spacers comprise an oxide or nitride material.

17. An MOS transistor formed on a semiconductor substrate of a first conductivity type comprising:
   (a) an interfacial layer formed on the substrate, wherein the interfacial layer comprises silicon nitride;
   (b) a high dielectric constant layer formed on the interfacial layer that comprises a material that is selected from the group consisting of $Ta_2O_5$, $Ta_2(O_{1-x}N_x)_5$ wherein x ranges from greater than 0 to 0.6, a solid solution of $(Ta_2O_5)_r$—$(TiO_2)_{1-r}$ wherein r ranges from about 0.9 to less than 1, a solid solution $(Ta_2O_5)_s$—$(Al_2O_3)_{1-s}$ wherein s ranges from 0.9 to less than 1, a solid solution of $(Ta_2O_5)_t$—$(ZrO_2)_{1-t}$ wherein t ranges from about 0.9 to less than 1, a solid solution of $(Ta_2O_5)_u$—$(HfO_2)_{1-u}$ wherein u ranges from about 0.9 to less than 1, and mixtures thereof wherein the interfacial layer separates the high dielectric constant layer from the substrate;

(c) a gate electrode having a width of less than 0.3 micron covering the high dielectric constant layer;

(d) first and second lightly doped regions of a second conductivity type disposed on respective areas of the substrate surface;

(e) a source and drain regions of a second conductivity type;

(f) a pair of first non-conductive spacers formed adjacent to the gate electrode and formed on the high dielectric constant layer; and (g) a pair of second non-conductive spacers that are adjacent to the first spacers and the high dielectric constant layer and are formed on the interfacial layer.

18. An MOS transistor formed on a semiconductor substrate of a first conductivity type comprising:

(a) an interfacial layer formed on the substrate, wherein the interfacial layer comprises silicon oxynitride;

(b) a high dielectric constant layer formed on the interfacial layer that comprises a material that is selected from the group consisting of $Ta_2O_5$, $Ta_2(O_{1-x}N_x)_5$ wherein x ranges from greater than 0 to 0.6, a solid solution of $(Ta_2O_5)_r$—$(TiO_2)_{1-r}$ wherein r ranges from about 0.9 to less than 1, a solid solution $(Ta_2O_5)_s$—$(Al_2O_3)_{1-s}$ wherein s ranges from 0.9 to less than 1, a solid solution of $(Ta_2O_5)_t$—$(ZrO_2)_{1-t}$ wherein t ranges from about 0.9 to less than 1, a solid solution of $(Ta_2O_5)_u$—$(HfO_2)_{1-u}$ wherein u ranges from about 0.9 to less than 1, and mixtures thereof wherein the interfacial layer separates the high dielectric constant layer from the substrate;

(c) a gate electrode having a width of less than 0.3 micron covering the high dielectric constant layer;

(d) first and second lightly doped regions of a second conductivity type disposed on respective areas of the substrate surface;

(e) a source and drain regions of a second conductivity type;

(f) a pair of first non-conductive spacers formed adjacent to the gate electrode and formed on the high dielectric constant layer; and (g) a pair of second non-conductive spacers that are adjacent to the first spacers and the high dielectric constant layer and are formed on the interfacial layer.

19. The MOS transistor of claim 1, wherein the interfacial layer comprises silicon oxide.

* * * * *